United States Patent
Hino

(10) Patent No.: US 9,410,673 B2
(45) Date of Patent: Aug. 9, 2016

(54) LUMINAIRE

(71) Applicant: Toshiba Lighting & Technology Corporation, Yokosuka-shi, Kanagawa-ken (JP)

(72) Inventor: Kiyokazu Hino, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 189 days.

(21) Appl. No.: 14/144,639

(22) Filed: Dec. 31, 2013

(65) Prior Publication Data

US 2014/0293606 A1 Oct. 2, 2014

(30) Foreign Application Priority Data

Apr. 2, 2013 (JP) ................................. 2013-076902

(51) Int. Cl.
| | |
|---|---|
| F21V 29/00 | (2015.01) |
| F21V 7/00 | (2006.01) |
| H01L 33/60 | (2010.01) |
| F21V 31/00 | (2006.01) |
| H01L 25/075 | (2006.01) |
| H01L 33/48 | (2010.01) |

(52) U.S. Cl.
CPC .............. *F21V 7/0066* (2013.01); *F21V 31/005* (2013.01); *H01L 33/60* (2013.01); *H01L 25/0753* (2013.01); *H01L 33/486* (2013.01); *H01L 2224/48091* (2013.01); *H01L 2924/12044* (2013.01); *H01L 2933/0058* (2013.01)

(58) Field of Classification Search
CPC ................. H01L 2224/48091; H01L 25/0753; H01L 2933/0058; H01L 33/60; F21V 31/005; F21V 7/0066

USPC ............................................ 362/249.01, 267
See application file for complete search history.

(56) References Cited

U.S. PATENT DOCUMENTS

| | | | | |
|---|---|---|---|---|
| 2003/0201451 | A1 | 10/2003 | Suehiro et al. | |
| 2005/0045903 | A1* | 3/2005 | Abe ..................... | H01L 21/568 257/100 |
| 2006/0138436 | A1* | 6/2006 | Chen .................... | H01L 33/486 257/98 |
| 2008/0203415 | A1* | 8/2008 | Thompson .......... | B29C 33/0022 257/98 |
| 2010/0213484 | A1* | 8/2010 | Lin ....................... | H01L 33/486 257/98 |

(Continued)

FOREIGN PATENT DOCUMENTS

| | | |
|---|---|---|
| EP | 1928026 A1 | 6/2008 |
| JP | 2006-135276 A | 5/2006 |

(Continued)

OTHER PUBLICATIONS

Aug. 4, 2014—(EP) Extended Search Report—App 13199734.8.

(Continued)

*Primary Examiner* — Ali Alavi
(74) *Attorney, Agent, or Firm* — Banner & Witcoff, Ltd.

(57) ABSTRACT

According to one embodiment, a luminaire includes a board provided in a main body part, a light-emitting element provided on a surface of the board, a surrounding wall member provided to surround the light-emitting element, and a joining part including a first portion which is provided between the board and the surrounding wall member and a second portion which is provided outside the surrounding wall member and covers at least a part of an outer wall of the surrounding wall member.

22 Claims, 3 Drawing Sheets

(56) References Cited

U.S. PATENT DOCUMENTS

| | | | |
|---|---|---|---|
| 2011/0037091 A1* | 2/2011 | Fushimi | H01L 33/486 257/98 |
| 2011/0058372 A1* | 3/2011 | Lerman | H05K 1/0204 362/235 |
| 2012/0104435 A1* | 5/2012 | Lee | H01L 33/54 257/98 |
| 2014/0293606 A1 | 10/2014 | Hino | |

FOREIGN PATENT DOCUMENTS

| | | |
|---|---|---|
| JP | 2008-235764 A | 10/2008 |
| JP | 2009-135485 A | 6/2009 |
| JP | 2012-138435 A | 7/2012 |
| JP | 2013-025935 A | 2/2013 |
| JP | 2013-045656 A | 3/2013 |
| JP | 2014-203574 A | 10/2014 |

OTHER PUBLICATIONS

May 31, 2016—(JP) Notification of Reasons for Refusal—App 2013-076902, Eng Tran.

Jun. 8, 2016—(JP) Notification of Reasons for Refusal—App 2016-093015, Eng Tran.

* cited by examiner

LUMINAIRE

CROSS-REFERENCE TO RELATED APPLICATIONS

This application is based upon and claims the benefit of priority from Japanese Patent Application No. 2013-076902, filed on Apr. 2, 2013; the entire contents of which are incorporated herein by reference.

FIELD

Embodiments described herein relate generally to a luminaire.

BACKGROUND

There is a luminaire including plural light emitting diodes (LEDs) mounted on a board, an annular surrounding wall member provided on the board so as to surround the plural light emitting diodes, and a sealing member filled inside the annular surrounding wall member.

In the luminaire as stated above, one end face of the surrounding wall member and the board are bonded by using an adhesive.

In such a case, if the coating amount of the adhesive is irregular, a portion where the adhesive is insufficient is formed between the surrounding wall member and the board. If the portion where the adhesive is insufficient is formed, bonding strength (fixing strength) becomes irregular, and a portion which is weak against external stress or thermal shock is partially formed. Thus, there is a fear that airtightness between the surrounding wall member and the board is reduced, performance is reduced by penetration of moisture and gas, and conduction failure or the like occurs due to peeling of the sealing member.

Besides, as the area of the board exposed at the inside of the surrounding wall member becomes small, light extraction efficiency becomes high. In this case, when the plural light-emitting diodes are mounted or the surrounding wall member is bonded, variability can occur at respective positions. Thus, a gap is needed between the plural light-emitting diodes or between the surrounding wall member and the plural light-emitting diodes. Accordingly, the area of the board exposed at the inside of the surrounding wall member can not be reduced, and there is also a problem that improvement of the light extraction efficiency is difficult.

DETAILED DESCRIPTION

Figure 1:
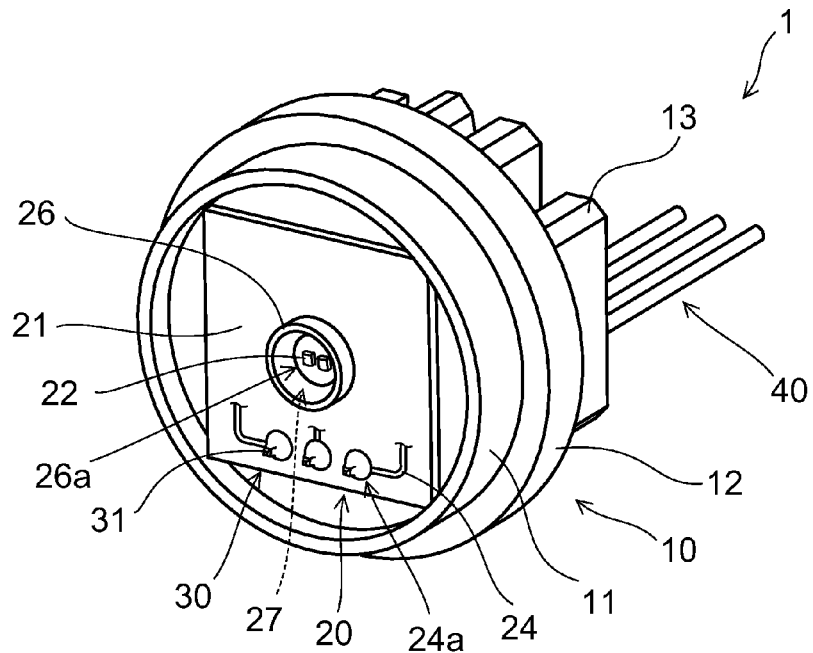
FIG. 1 is a schematic perspective view for exemplifying a luminaire 1 of an embodiment.

According to a first embodiment, a luminaire includes a board provided in a main body part, a light-emitting element provided on a surface of the board, a surrounding wall member provided to surround the light-emitting element, and a joining part including a first portion which is provided between the board and the surrounding wall member and a second portion which is provided outside the surrounding wall member and covers at least a part of an outer wall of the surrounding wall member.

According to this luminaire, airtightness between the surrounding wall member and the board, resistance against external stress and thermal shock, and light extraction efficiency can be improved.

According to a second embodiment, in the luminaire of the first embodiment, the joining part further includes a third portion which is provided inside the surrounding wall member and covers at least a part of an inner wall of the surrounding wall member.

According to this luminaire, the airtightness between the surrounding wall member and the board, the resistance against external stress and thermal shock, and the light extraction efficiency can be further improved.

According to a third embodiment, in the luminaire of the first embodiment, reflectivity of the joining part to light emitted from the light-emitting element is higher than that of the board or a wiring pattern.

According to this luminaire, the light extraction efficiency can be further improved.

According to a fourth embodiment, in the luminaire of the first embodiment, a following expression is satisfied:

$$Wc \geq L/2$$

where a width of the third portion is Wc, and a distance between an inner wall of the surrounding wall member and an end face of the light-emitting element is L.

According to this luminaire, the light extraction efficiency can be further improved.

According to a fifth embodiment, in the luminaire of the first embodiment, the light-emitting element is electrically connected to a wiring pattern provided on the surface of the board, and the luminaire further includes a power-supply terminal which is electrically connected to the wiring pattern, and a socket which is fitted to the power-supply terminal.

According to a sixth embodiment, in the luminaire of the first embodiment, the first portion is membranous.

According to a seventh embodiment, in the luminaire of the first embodiment, a thickness of the second portion is larger than a thickness of the first portion.

According to an eighth embodiment, in the luminaire of the first embodiment, the second portion includes a first surface inclined in a direction in which as a part thereof approaches the board side, the part goes away from the outer wall of the surrounding wall member.

According to a ninth embodiment, in the luminaire of the eighth embodiment, the first surface is one of a concave curved surface, a convex curved surface and a flat surface.

According to a tenth embodiment, in the luminaire of the second embodiment, a thickness of the third portion is larger than a thickness of the first portion.

According to an eleventh embodiment, in the luminaire of the second embodiment, a thickness of the third portion is smaller than a thickness of the second portion.

According to a twelfth embodiment, in the luminaire of the second embodiment, the third portion includes a second surface inclined in a direction in which as a part thereof approaches the board side, the part goes away from the inner wall of the surrounding wall member.

According to a thirteenth embodiment, in the luminaire of the twelfth embodiment, the second surface is one of a concave curved surface, a convex curved surface and a flat surface.

According to a fourteenth embodiment, in the luminaire of the second embodiment, the third portion covers a surface of the board exposed at the inside of the surrounding wall member.

According to a fifteenth embodiment, in the luminaire of the first embodiment, the joining part includes a resin and a particle made of a material having a high reflectivity to light emitted from the light-emitting element.

According to a sixteenth embodiment, in the luminaire of the fifteenth embodiment, the resin is one of silicone resin and epoxy resin, and the material having the high reflectivity to the light emitted from the light-emitting element is titanium oxide.

According to a seventeenth embodiment, in the luminaire of the second embodiment, the inner wall of the surrounding wall member is parallel to a front direction of the luminaire.

According to an eighteenth embodiment, in the luminaire of the first embodiment, the surrounding wall member is annular-shaped.

According to a nineteenth embodiment, the luminaire of the first embodiment further includes a sealing part provided at a center part of the surrounding wall member.

According to a twentieth embodiment, in the luminaire of the nineteenth embodiment, the sealing part includes a translucent material and a phosphor.

Hereinafter, one embodiment will be exemplified with reference to the drawings. Incidentally, in the respective drawings, the same components are denoted by the same reference numerals, and their detailed explanation will be appropriately omitted.

Figure 2:
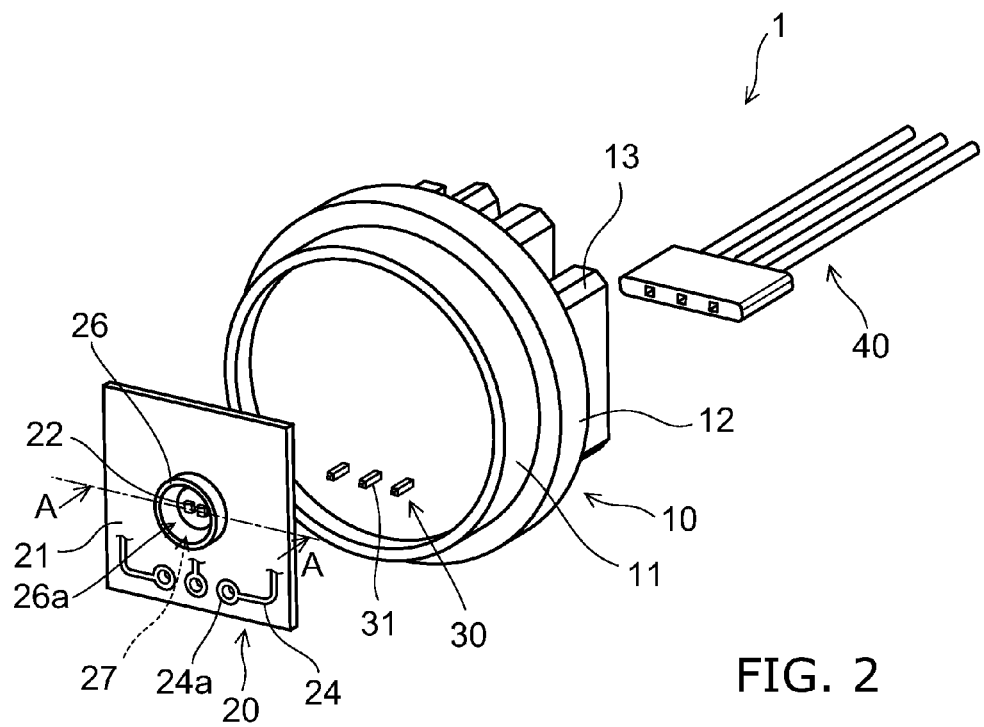
FIG. 2 is a schematic exploded view for exemplifying the luminaire 1.

FIG. 1 and FIG. 2 are schematic perspective views for exemplifying a luminaire 1 of this embodiment.

Incidentally, FIG. 1 is a schematic perspective view of the luminaire 1, and FIG. 2 is a schematic exploded view of the luminaire 1.

In FIG. 1 and FIG. 2, a sealing part 27 is omitted in order to make the drawings easy to see.

Figure 3:
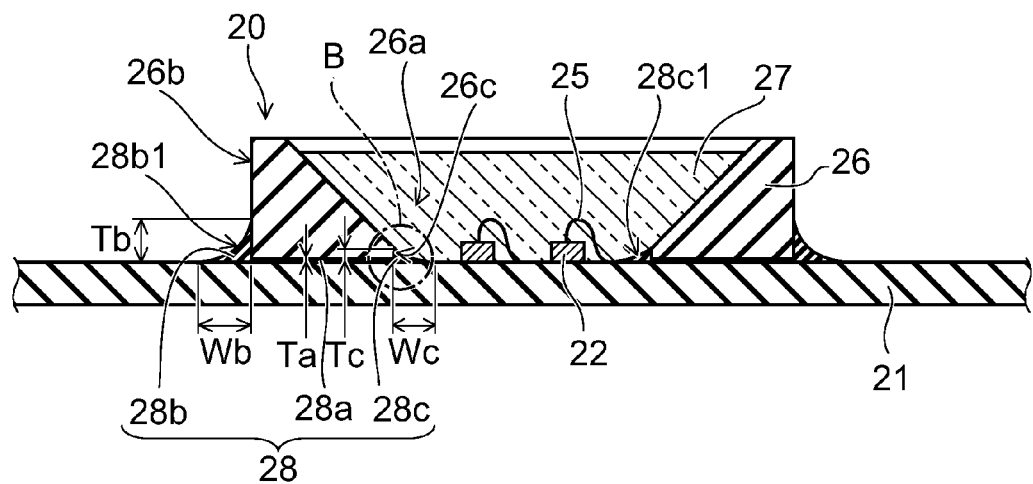
FIG. 3 is an A-A line sectional view in FIG. 2.

FIG. 3 is an A-A line sectional view in FIG. 2.

As shown in FIG. 1 and FIG. 2, the luminaire 1 includes a main body part 10, a light-emitting part 20, a power-supply part 30 and a socket 40.

The main body part 10 includes a housing part 11, a flange part 12 and fins 13. The housing part 11 is cylindrical and protrudes from one surface of the flange part 12. The light-emitting part 20 is housed inside the housing part 11. Besides, a power-supply terminal 31 of the power-supply part 30 protrudes inside the housing part 11.

The flange part 12 is disk-shaped, one surface thereof is provided with the housing part 11, and the other surface is provided with the fins 13.

The plural fins 13 are provided to protrude from the surface of the flange part 12. The plural fins 13 are plate-shaped, and function as thermal radiation fins.

The main body part 10 has the function of housing the light-emitting part 20, the power-supply part 30 and the like and the function of radiating heat generated in the light-emitting part 20 and the power-supply part 30 to the outside of the luminaire 1.

Thus, taking it into account that the heat is radiated to the outside, the main body part 10 can be formed of a material having a high thermal conductivity. For example, the main body part 10 can be formed of aluminum, aluminum alloy, high thermal conductivity resin or the like. The high thermal conductivity resin is such that for example, resin such as PET or nylon is mixed with fibers or particles of carbon having high thermal conductivity or aluminum oxide.

In this case, a portion to radiate the heat to the outside, such as the fins 13, is formed of a material having a high thermal conductivity, and the other portion can be formed of resin or the like.

Besides, when a main portion of the main body part 10 is formed of a conductive material, in order to ensure the electrical insulation between the power-supply terminal 31 and the conductive material of the main body part 10, the periphery of the power-supply terminal 31 is covered with an insulating material (not shown), and further, the conductive material may be arranged on the periphery thereof. The insulating material is, for example, resin, and is preferably a material having a high thermal conductivity. Besides, the main body part 10 may be provided with an attachment part detachable from and attachable to a vehicle lighting fixture.

As shown in FIG. 3, the light-emitting part 20 includes a board 21, light-emitting elements 22, a surrounding wall member 26, a sealing part 27 and a joining part 28.

The board 21 is provided inside the housing part 11 of the main body part 10.

The board 21 is plate-shaped, and the surface is provided with a wiring pattern 24.

The material and structure of the board 21 are not particularly limited. For example, the board 21 may be formed of an inorganic material (ceramic) such as aluminum oxide or aluminum nitride, or an organic material such as paper phenol or glass epoxy. Besides, the board 21 may be such that a surface of a metal plate is coated with an insulator. Incidentally, when the surface of the metal plate is coated with the insulator, the insulator may be made of an organic material or an inorganic material.

In this case, when the amount of heat generation of the light-emitting elements 22 is large, from the viewpoint of thermal radiation, the board 21 is preferably formed of a material having a high thermal conductivity. As the material having the high thermal conductivity, for example, ceramics such as aluminum oxide or aluminum nitride, high thermal conductivity resin, a metal plate whose surface is coated with an insulator, and the like can be exemplified.

Besides, the board 21 may be a single-layer board or a mufti-layer board.

The plural light-emitting elements 22 are mounted on the wiring pattern 24 provided on the surface of the board 21.

The light-emitting element 22 can include a not-shown electrode on a surface (upper surface) at an opposite side to a side where the light-emitting element is provided on the wiring pattern 24. Incidentally, the not-shown electrode may be provided on a surface (lower surface) at the side where the light-emitting element is provided on the wiring pattern 24 and the surface (upper surface) at the opposite side to the side where the light-emitting element is provided on the wiring pattern 24, or may be provided on only one of the surfaces.

The electrode provided on the lower surface of the light-emitting element 22 is electrically connected to a not-shown mount pad provided on the wiring pattern 24 through a conductive thermosetting material such as silver paste. The not-shown electrode provided on the upper surface of the light-emitting element 22 is electrically connected to a not-shown wiring pad provided on the wiring pattern 24 through a wiring 25.

The light-emitting element 22 is, for example, a light-emitting diode, an organic light-emitting diode or a laser diode.

A light-emitting surface of the light-emitting element 22 is directed to the front side of the luminaire 1, and emits light mainly toward the front side of the luminaire.

The number and size of the light-emitting elements 22 are not limited to exemplified ones, and can be appropriately changed according to the size and use of the luminaire 1.

The wiring pattern 24 is provided on at least one of the surfaces of the board 21.

Although the wiring pattern 24 may be provided on both the surfaces of the board 21, in order to reduce the manufacturing cost, the wiring pattern is preferably provided on one of the surfaces of the board 21.

The wiring pattern 24 is provided with input terminals 24a.

The plural input terminals 24a are provided. The power-supply terminals 31 of the power-supply part 30 are electrically connected to the input terminals 24a. Thus, the light-emitting elements 22 are electrically connected to the power-supply part 30 through the wiring pattern 24.

The wiring 25 electrically connects the not-shown electrode provided on the upper surface of the light-emitting element 22 to the not-shown wiring pad provided on the wiring pattern 24.

The wiring 25 is, for example, a wire mainly containing gold. However, the material of the wiring 25 is not limited to the material mainly containing gold, and for example, a material mainly containing copper or a material mainly containing aluminum may be used.

The wiring 25 is electrically connected to the not-shown electrode provided on the upper surface of the light-emitting element 22 and the not-shown wiring pad provided on the wiring pattern 24 by ultrasonic welding or thermal welding. The wiring 25 can be electrically connected to the not-shown electrode provided on the upper surface of the light-emitting element 22 and the not-shown wiring pad provided on the wiring pattern 24 by using, for example, a wire bonding method.

In addition, a circuit component such as a not-shown control element to control current flowing through the light-emitting element 22 can be appropriately provided. The circuit component such as the not-shown control element can be mounted on the wiring pattern 24.

The surrounding wall member 26 is provided on the board 21 so as to surround the plural light-emitting elements 22. The surrounding wall member 26 has, for example, an annular shape, and the plural light-emitting elements 22 are exposed at a center part 26a.

The shape of the surrounding wall member 26 may be an elliptical shape or a polygonal shape such as a square, a hexagon or an octagon, and the shape is not particularly limited.

The surrounding wall member 26 can be formed of, for example, a resin, such as PBT (polybutylene terephthalate) or PC (polycarbonate), or ceramics.

When the material of the surrounding wall member 26 is the resin, the reflectivity to light emitted from the light-emitting element 22 can be improved by mixing particles of titanium oxide or the like.

Incidentally, no limitation is made to the particles of titanium oxide, and particles made of a material having a high reflectivity to the light emitted from the light-emitting element 22 has only to be mixed.

A side wall surface on the center 26a side of the surrounding wall member 26 is an inclined surface. Part of the light emitted from the light-emitting element 22 is reflected by the side wall surface on the center part 26a side of the surrounding wall member 26, and is emitted toward the front side of the luminaire 1. That is, the surrounding wall member 26 can be made to have also the function of a reflector. Incidentally, the form of the surrounding wall member 26 is not limited to the exemplified one and can be appropriately changed.

The sealing part 27 is provided at the center part 26a of the surrounding wall member 26. The sealing part 27 is provided so as to cover the inside of the surrounding wall member 26.

The sealing part 27 is formed of a translucent material. The sealing part 27 can be formed of, for example, silicone resin.

The sealing part 27 can be formed by filling, for example, a resin in the center part 26a of the surrounding wall member 26. The filling of the resin can be performed by using, for example, a liquid constant quantity discharging apparatus such as a dispenser.

When the resin is filled in the center part 26a of the surrounding wall member 26, mechanical contact from the outside to the light-emitting elements 22, the wiring pattern 24 exposed at the center part 26a of the surrounding wall member 26 and the wiring 25 can be suppressed. Besides, the attachment of air or moisture to the light-emitting elements 22, the wiring pattern 24 exposed at the center part 26a of the surrounding wall member 26 and the wiring 25 can be suppressed. Thus, the reliability of the luminaire 1 can be improved.

Besides, the sealing part 27 can include a phosphor. The phosphor is, for example, a YAG phosphor (Yttrium Aluminum Garnet phosphor).

For example, when the light-emitting element 22 is a blue light-emitting diode, and the phosphor is the YAG phosphor, the YAG phosphor is excited by the blue light emitted from the light-emitting element 22, and yellow fluorescence is emitted from the YAG phosphor. The blue light and the yellow light are mixed, so that white light is emitted from the luminaire 1. Incidentally, the kind of the phosphor and the kind of the light-emitting element 22 are not limited to the exemplified ones, and can be appropriately changed according to the use of the luminaire 1 so that a desired light-emitting color can be obtained.

The joining part 28 joins the surrounding wall member 26 to the board 21.

Incidentally, the details of the joining part 28 will be described later.

The power-supply part 30 is provided with the plural power-supply terminals 31.

The plural power-supply terminal 31 extends in the inside of the housing part 11 and the flange part 12. One ends of the plural power-supply terminals 31 protrude from a bottom surface of the housing part 11 and are electrically connected to the input terminals 24a of the wiring pattern 24. The other ends of the plural power-supply terminals 31 are exposed from the opposite side to the side of the main body part 10 where the board 21 is provided.

Incidentally, the number, arrangement, form and the like of the power-supply terminals 31 are not limited to the exemplified ones and can be appropriately changed.

Besides, the power-supply part 30 can also include a not-shown board and a circuit component such as a capacitor or a resistor. Incidentally, the not-shown board and the circuit component can be provided, for example, inside the housing part 11 or the flange part 12.

The socket 40 is fitted to the ends of the plural power-supply terminals 31 exposed to the opposite side to the side of the main body part 10 where the board 21 is provided.

A not-shown power supply and the like are electrically connected to the socket 40.

Thus, when the socket 40 is fitted to the ends of the power-supply terminals 31, the not-shown power supply and the like are electrically connected to the light-emitting elements 22.

The socket 40 can be connected to components on the main body 10 side by using an adhesive or the like.

Next, the joining part 28 will be further described.

As shown in FIG. 3, the joining part 28 includes a first portion 28a, a second portion 28b and a third portion 28c.

The first portion 28a, the second portion 28b and the third portion 28c are integrally formed.

The first portion 28a is provided between the surrounding wall member 26 and the board 21.

The first portion 28a is membranous.

The second portion 28b is provided outside an outer wall 26b of the surrounding wall member 26, and covers at least a part of the outer wall 26b of the surrounding wall member 26.

A thickness Tb of the second portion 28b is larger than a thickness Ta of the first portion 28a.

The thickness Tb of the second portion 28b and a width Wb of the second portion 28b are not particularly limited.

Incidentally, the thickness Tb of the second portion 28b is a size from the surface of the board 21 to the highest position attached to the outer wall 26b of the surrounding wall member 26.

The width Wb of the second portion 28b is a size from the outer wall 26b of the surrounding wall member 26 to the farthest position from the outer wall 26b attached to the surface of the board 21.

If the width Wb of the second portion 28b and the thickness Tb of the second portion 28b are increased, joining strength (fixing strength) between the surrounding wall member 26 and the board 21 can be increased. However, if the width Wb of the second portion 28b and the thickness Tb of the second portion 28b are excessively increased, a distance to a circuit component or the like provided outside the surrounding wall member 26 becomes excessively long, and there is a fear that the luminaire 1 can not be miniaturized. Thus, the width Wb of the second portion 28b and the thickness Tb of the second portion 28b are preferably made as small as possible according to the required joining strength (fixing strength).

The second portion 28b includes a surface 28b1 (corresponding to an example of the first surface) inclined in a direction in which as a part thereof approaches the board 21 side, the part goes away from the outer wall 26b of the surrounding wall member 26.

The surface 28b1 can be made a curved surface or can be made a flat surface. Besides, when the surface 28b1 is made the curved surface, the surface can be made a concave curved surface as shown in FIG. 3 or can be made a convex curved surface.

Incidentally, as described later, when the joining part 28 is formed by hardening a resin, the surface 28b1 can be made the concave curved surface.

The third portion 28c is provided inside an inner wall 26c of the surrounding wall member 26, and covers at least a part of the inner wall 26c of the surrounding wall member 26.

A thickness Tc of the third portion 28c is larger than the thickness Ta of the first portion 28a.

The thickness Tc of the third portion 28c can be made smaller than the thickness Tb of the second portion 28b.

Incidentally, the thickness Tc of the third portion 28c is a size from the surface of the board 21 to the highest position attached to the inner wall 26c of the surrounding wall member 26.

The third portion 28c includes a surface 28c1 (corresponding to an example of the second surface) inclined in a direction in which as a part thereof approaches the board 21 side, the part goes away from the inner wall 26c of the surrounding wall member 26.

The surface 28c1 can be made a curved surface or can be made a flat surface. Besides, when the surface 28c1 is made the curved surface, the surface can be made a concave curved surface as shown in FIG. 3 or can be made a convex curved surface.

Incidentally, as described later, when the joining part 28 is formed by hardening a resin, the surface 28c1 can be made the concave curved surface.

The joining part 28 (the first portion 28a, the second portion 28b and the third portion 28c) is made of a mixture of resin, such as silicone resin or epoxy resin, and particles of titanium oxide or the like).

The reflectivity of the joining part 28 to the light emitted from the light-emitting element 22 is higher than that of the board 21 or the wiring pattern 24.

When the joining part 28 is formed by using the material as stated above, since the reflectivity to the light emitted from the light-emitting element 22 can be made higher than the board 21 or the wiring pattern 24, the light extraction efficiency can be improved.

Incidentally, no limitation is made to the particles of titanium oxide, and particles made of a material having a high reflectivity to the light emitted from the light-emitting element 22 has only to be mixed.

The joining part 28 can be formed by, for example, a following procedure.

First, a resin, such as silicone resin or epoxy resin, particles of titanium oxide or the like, a solvent and the like are mixed to form an adhesive having fluidity.

Next, the adhesive is applied to a specified position on the board 21 by using a dispenser or the like.

Subsequently, the surrounding wall member 26 is pressed to the applied adhesive, and the adhesive is made to flow out to the outside and the inside of the surrounding wall member 26.

At this time, the adhesive creeps up the outer wall 26b of the surrounding wall member 26 and the inner wall 26c of the surrounding wall member 26, and the surface 28b1 and the surface 28c1 are formed.

Thereafter, the adhesive is hardened by evaporating the solvent and the like, and the joining part 28 is formed. The board 21 and the surrounding wall member 26 are joined through the joining part 28.

Incidentally, the adhesive can be made a mixture of an adhesive containing a resin, such as silicone resin or epoxy resin, and particles of titanium oxide or the like.

Next, the third portion 28c will be further described.

Figure 4:
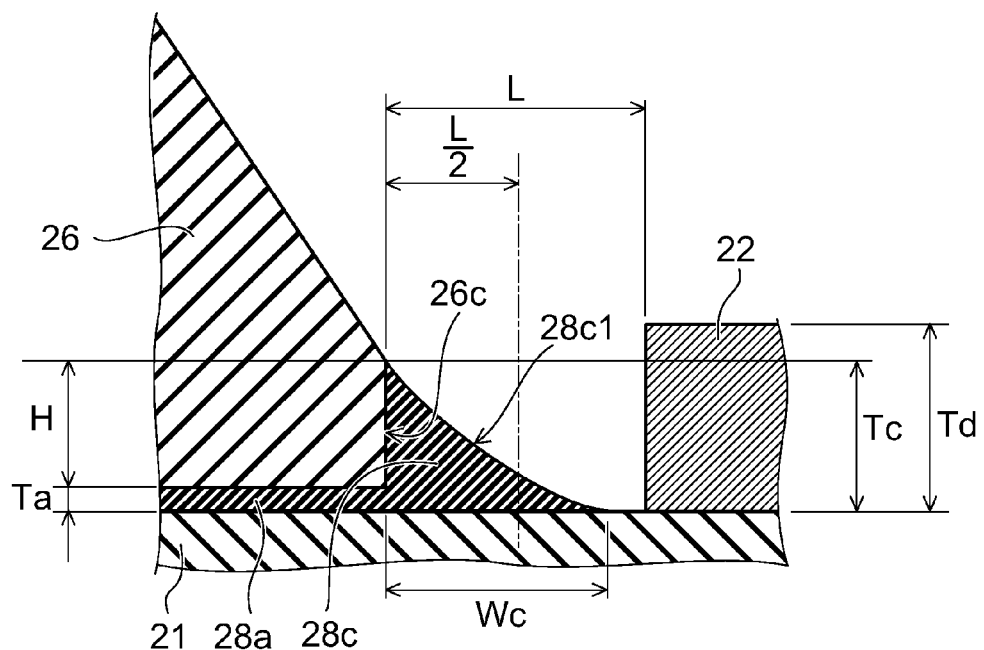
FIG. 4 is a schematic sectional view for exemplifying a form of a third portion 28c.
Figure 5:
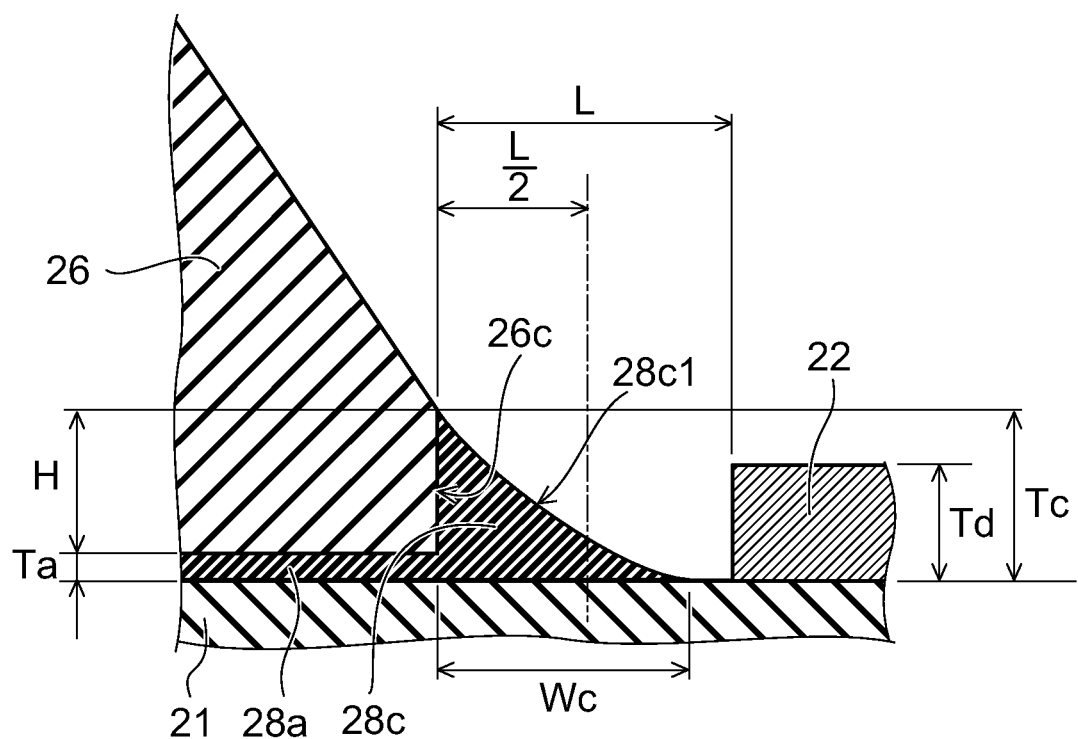
FIG. 5 is a schematic sectional view for exemplifying the form of the third portion 28c.

FIG. 4 and FIG. 5 are schematic sectional views for exemplifying a form of the third portion 28c.

Incidentally, FIG. 4 and FIG. 5 are schematic enlarged views of a part B in FIG. 3.

As shown in FIG. 4 and FIG. 5, the inner wall 26c of the surrounding wall member 26 is almost parallel to a light emitting direction (front direction of the luminaire 1).

Thus, the light emitted from the light-emitting element 22 and incident on the inner wall 26c of the surrounding wall member 26 becomes hard to be emitted to the front side of the luminaire 1, and there is a fear that the light extraction efficiency can not be improved.

As shown in FIG. 4 and FIG. 5, if the inner wall 26c of the surrounding wall member 26 is covered with the third portion 28c, light reflected by the inner wall 26c of the surrounding wall member 26 can be decreased. Besides, as described before, the surrounding wall member 26 is formed of the material having the high reflectivity to the light emitted from the light-emitting element 22. As a result, the light extraction efficiency can be increased.

In recent years, there is a tendency that a thickness Td of the light-emitting element 22 becomes small (thickness of the light-emitting element 22 becomes thin).

Besides, when consideration is given to that the surrounding wall member 26 is formed using a forming die or the like, a height H of the inner wall 26c is required to have a certain degree of length.

Thus, as shown in FIG. 5, the upper surface of the light-emitting element 22 as the light-emitting surface is lower than the upper end position of the inner wall 26c.

As a result, there is a tendency that the light emitted from the light-emitting element 22 becomes easily incident on the inner wall 26c of the surrounding wall member 26.

In this embodiment, since the third portion 28c covers the inner wall 26c of the surrounding wall member 26, even if the thickness Td of the light-emitting element 22 becomes small, the light extraction efficiency can be improved.

Besides, in general, the reflectivity of the surface of the board 21 is low for the light emitted from the light-emitting element 22. Thus, if the width Wc of the third portion 28c is increased, the light extraction efficiency can be improved.

Incidentally, the width Wc of the third portion 28c is a size from the inner wall 26c of the surrounding wall member 26 to the farthest position from the inner wall 26c attached to the surface of the board 21.

According to the knowledge obtained by the inventor, when a distance between the inner wall 26c of the surrounding wall member 26 and an end face of the light-emitting element 22 is L, if Wc≥L/2 is established, the light extraction efficiency can be improved.

Incidentally, the surface of the board 21 exposed at the inside of the surrounding wall member 26 may be covered with the third portion 28c.

According to the embodiment exemplified above, the luminaire can be realized in which the airtightness between the surrounding wall member and the board, the resistance to external stress and heat shock, and the light extraction efficiency can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A luminaire comprising:
   a board provided in a main body part;
   a light-emitting element provided on a surface of the board;
   a surrounding wall member provided to surround the light-emitting element: and
   a joining part including a first portion which is provided between the board and the surrounding wall member and a second portion which is provided outside the surrounding wall member and covers at least a part of an outer wall of the surrounding wall member, the second portion including a first surface inclined in a direction in which as a part thereof approaches the board side, the part going away from an outer wall of the surrounding wall member.

2. The luminaire according to claim 1, wherein the joining part further includes a third portion which is provided inside the surrounding wall member and covers at least a part of an inner wall of the surrounding wall member.

3. The luminaire according to claim 2, wherein a following expression is satisfied:

$$Wc \geq L/2$$

where a width of the third portion is Wc, and a distance between the inner wall of the surrounding wall member and an end face of the light-emitting element is L.

4. The luminaire according to claim 2, wherein a thickness of the third portion is larger than a thickness of the first portion.

5. The luminaire according to claim 2, wherein a thickness of the third portion is smaller than a thickness of the second portion.

6. The luminaire according to claim 2, wherein the third portion includes a second surface inclined in a direction in which as a part thereof approaches the board side, the part goes away from the inner wall of the surrounding wall member.

7. The luminaire according to claim 6, wherein the second surface is one of a concave curved surface, a convex curved surface and a flat surface.

8. The luminaire according to claim 2, wherein the third portion covers a surface of the board exposed at the inside of the surrounding wall member.

9. The luminaire according to claim 2, wherein the inner wall of the surrounding wall member is parallel to a front direction of the luminaire.

10. The luminaire according to claim 1, wherein a reflectivity of the joining part to light emitted from the light-emitting element is higher than that of one of the board and a wiring pattern.

11. The luminaire according to claim 1, wherein
    the light-emitting element is electrically connected to a wiring pattern provided on the surface of the board, and
    the luminaire further comprises:
      a power-supply terminal electrically connected to the wiring pattern; and
      a socket fitted to the power-supply terminal.

12. The luminaire according to claim 1, wherein the first portion is membranous.

13. The luminaire according to claim 1, wherein a thickness of the second portion is larger than a thickness of the first portion.

14. The luminaire according to claim 1, wherein the first surface is one of a concave curved surface, a convex curved surface and a flat surface.

15. The luminaire according to claim 1, wherein the joining part includes a resin and a particle made of a material having a high reflectivity to light emitted from the light-emitting element.

16. The luminaire according to claim 15, wherein
    the resin is one of silicone resin and epoxy resin, and
    the material having the high reflectivity to the light emitted from the light-emitting element is titanium oxide.

17. The luminaire according to claim 1, wherein the surrounding wall member is annular-shaped.

18. The luminaire according to claim 1, further comprising a sealing part provided at a center part of the surrounding wall member.

19. The luminaire according to claim 18, wherein the sealing part includes a translucent material and a phosphor.

20. A luminaire comprising:
    a board provided in a main body part;
    a light-emitting element provided on a surface of the board;

a surrounding wall member provided to surround the light-emitting element; and a joining part including a first portion which is provided between the board and the surrounding wall member and a second portion which is provided outside the surrounding wall member and covers at least a part of an outer wall of the surrounding wall member, the joining part further including a third portion which is provided inside the surrounding wall member and covers at least a part of an inner wall of the surrounding wall member, the third portion including a second surface inclined in a direction in which as a part thereof approaches the board side, the part going away from the inner wall of the surrounding wall member.

21. The luminaire according to claim 20, wherein the second surface is one of a concave curved surface, a convex curved surface and a flat surface.

22. The luminaire according to claim 20, wherein the light-emitting element is electrically connected to a wiring pattern provided on the surface of the board, and the luminaire further comprises:

a power-supply terminal electrically connected to the wiring pattern; and a socket fitted to the power-supply terminal.

* * * * *